(12) United States Patent
Pierce et al.

(10) Patent No.: US 7,536,615 B1
(45) Date of Patent: May 19, 2009

(54) LOGIC ANALYZER SYSTEMS AND METHODS FOR PROGRAMMABLE LOGIC DEVICES

(75) Inventors: David Pierce, Wheaton, IL (US);
Michael Hammer, Westchester, IL (US); Brian M. Caslis, Wilsonville, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 310 days.

(21) Appl. No.: 11/691,003

(22) Filed: Mar. 26, 2007

(51) Int. Cl.
*G01R 31/28* (2006.01)

(52) U.S. Cl. .......................... 714/725; 714/37; 714/39; 714/45; 714/724; 714/732; 714/742; 716/4; 716/16; 716/17; 716/18; 326/37; 326/38; 326/39; 703/28

(58) Field of Classification Search .................. None
See application file for complete search history.

(56) References Cited

U.S. PATENT DOCUMENTS

| | | | |
|---|---|---|---|
| 4,642,487 A * | 2/1987 | Carter | 326/41 |
| 4,706,216 A | 11/1987 | Carter | |
| 4,758,985 A | 7/1988 | Carter | |
| 5,448,703 A | 9/1995 | Amini et al. | |
| 6,247,147 B1 | 6/2001 | Beenstra et al. | |
| 6,384,627 B1 | 5/2002 | Fross et al. | |
| 6,389,558 B1 | 5/2002 | Herrmann et al. | |
| 6,686,759 B1 | 2/2004 | Swamy | |
| 6,704,889 B2 * | 3/2004 | Veenstra et al. | 714/39 |
| 6,748,456 B1 | 6/2004 | Stanton et al. | |
| 6,754,862 B1 | 6/2004 | Hoyer et al. | |
| 6,834,360 B2 * | 12/2004 | Corti et al. | 714/37 |
| 6,848,055 B1 | 1/2005 | Yarch | |
| 7,200,776 B2 * | 4/2007 | Harris | 714/45 |
| 7,480,839 B2 * | 1/2009 | Smith et al. | 714/715 |
| 7,501,855 B2 * | 3/2009 | Hutchings et al. | 326/38 |
| 2002/0184477 A1 * | 12/2002 | Swaine et al. | 712/227 |
| 2003/0212940 A1 | 11/2003 | Wong | |
| 2004/0153790 A1 * | 8/2004 | Swoboda et al. | 714/25 |
| 2004/0187054 A1 * | 9/2004 | Dervisoglu et al. | 714/724 |

OTHER PUBLICATIONS

Xilinx, Inc., ChipScope Pro Software and Cores User Manual, Feb. 26, 2005, 222 pages.*
Altera Corporation, 10. Design Debugging Using the SignaiTap II Embedded Lo.qic Analyzer, May 2005, 48 pages.*
U.S. Appl. No. 10/347,058, filed Jan. 17, 2003, Mantey, Johnathan G.
IEEE Std. 1149.1. IEEE Standard Test Access Port and Boundary Scan Architecture, 1990, 3 pages.

(Continued)

*Primary Examiner*—John P Trimmings
(74) *Attorney, Agent, or Firm*—Haynes and Boone, LLP

(57) ABSTRACT

A programmable logic device includes, in accordance with one embodiment, a plurality of logic blocks; an interconnect structure adapted to route signals among the logic blocks; and a memory for storing data within the programmable logic device. A first set of the logic blocks are configured as logic analyzer trigger units adapted to each receive one or more input signals from within the programmable logic device and provide a corresponding trigger unit output signal. A portion of the memory stores a logic analyzer trigger expression, with the trigger unit output signals provided to the memory as address signals for the trigger expression.

20 Claims, 6 Drawing Sheets

OTHER PUBLICATIONS

IEEE Std. 1149.1. IEEE Standard Test Access Port and Boundary Scan Architecture, 1990, 6 pages.

Xilinx, Inc., ChipScope Pro Software and Cores User Manual, Oct. 29, 2002, 26 pages.

Altera Corporation, 10. Design Debugging Using the SignalTap II Embedded Logic Analyzer, May 2005, 48 pages.

Lattice Semiconductor Corporation, ORCA Series Boundary Scan, Aug. 2004, 10 pages.

Xilinx, Inc., ChipScope Pro Software and Cores User Manual, Feb. 26, 2005, 222 pages.

U.S. Appl. No. 11/691,040, filed Mar. 26, 2007, Pierce et al.

* cited by examiner

LOGIC ANALYZER SYSTEMS AND METHODS FOR PROGRAMMABLE LOGIC DEVICES

TECHNICAL FIELD

The present invention relates generally to electrical circuits and, more particularly, to logic analyzer techniques for programmable devices.

BACKGROUND

The programmable nature of a programmable logic device (PLD), such as for example a field programmable gate array (FPGA) or a complex programmable logic device (CPLD), allows developers to allocate (e.g., during design and test phases) a portion of the PLD's logic and memory resources to debug intellectual property (IP) cores (e.g., soft IP cores or other types of user-defined logic implementations) that have also been programmed into the PLD. For example, a complete logic analyzer system may be programmed as a soft IP core into the PLD, which may then be used to debug other soft IP cores in the same PLD. This approach has the advantage of being able to probe many internal signals, while using fewer PLD input/output (I/O) pins than would be used by employing only an external logic analyzer device, and in some applications, it may be possible to eliminate the need for expensive stand-alone logic analyzers altogether.

As an example, a user of a PLD-implemented logic analyzer should be able to enter trigger expressions that determine when the logic analyzer begins capturing data. From a user's perspective the entry method should be straightforward and intuitive while also allowing arbitrarily complex trigger expressions to be entered. Furthermore, the logic analyzer should be able to accurately capture the user's trigger expression and implement it in software and/or hardware.

In general, conventional approaches generate logic analyzer IP cores to be loaded into the PLD along with user-defined IP, with software running externally to the PLD to configure the logic analyzer IP core, read the captured data, and display for a user. However, conventional approaches generally fail to provide state capability, fail to provide flexibility in combining signal conditions to achieve a desired logic analyzer result, and/or provide methods that are difficult for a user to enter complex trigger expressions.

As a result, there is a need for providing improved techniques for implementing a logic analyzer within a programmable logic device.

SUMMARY

In accordance with one embodiment of the present invention, a programmable logic device includes a plurality of logic blocks; an interconnect structure adapted to route signals among the logic blocks; memory for storing data within the programmable logic device; wherein one or more of the logic blocks are configured as trigger units, the trigger units each adapted to receive one or more input signals from within the programmable logic device and to provide a corresponding trigger unit output signal; and wherein the memory stores a trigger expression, with the trigger unit output signals provided to the memory as address signals for the trigger expression.

In accordance with another embodiment of the present invention, a programmable logic device includes a plurality of logic blocks; means for routing signals among the logic blocks; means for storing data within the programmable logic device; means for monitoring one or more signals of the logic blocks to provide trigger unit output signals; and wherein the storing means is adapted to store a trigger expression, with the trigger unit output signals provided to the storing means as address signals for the trigger expression.

In accordance with another embodiment of the present invention, a computer-readable medium on which is stored a computer program for performing a method includes programming a programmable logic device to provide trigger units of a logic analyzer, the trigger units each monitoring one or more input signals within the programmable logic device to provide a corresponding trigger unit output signal; and programming a memory of the programmable logic device to store a trigger expression of the logic analyzer, with the trigger unit output signals provided to the memory as address signals for the trigger expression.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
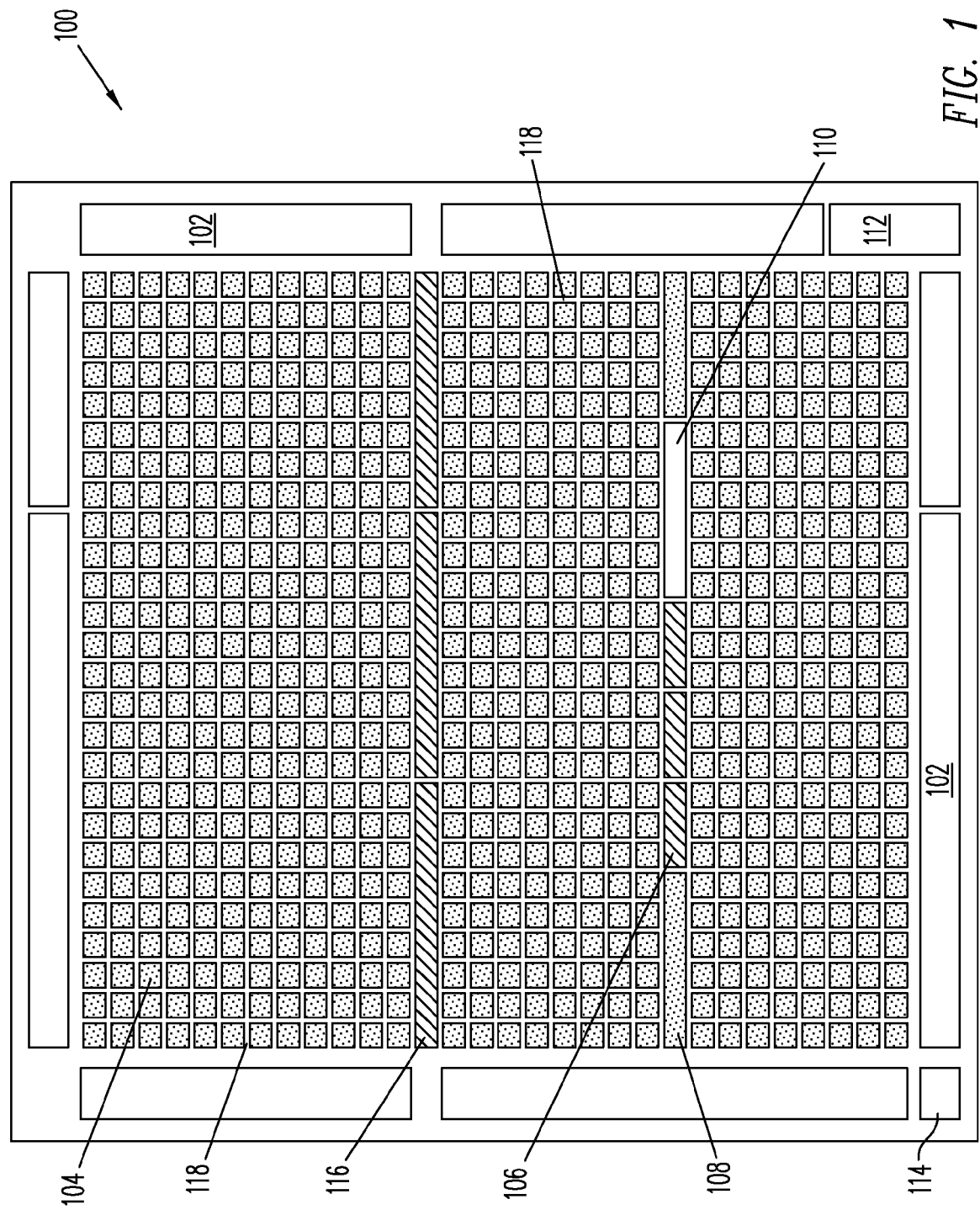
FIG. 1 shows a block diagram illustrating an example of a programmable logic device in accordance with an embodiment of the present invention.

FIG. 1 shows a block diagram illustrating a programmable logic device (PLD) 100 in accordance with an embodiment of the present invention. PLD 100 (e.g., an FPGA, a CPLD, or a field programmable system on a chip (FPSC)) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., supports one or more I/O and/or memory interface standards) for PLD 100, while programmable logic blocks 104 provide logic functionality (e.g., LUT-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., DSP blocks or other forms of multiply and accumulate circuit functionality), and/or routing resources 118. It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, is not limiting and may depend upon the desired application. For example, special function blocks 116 are optional and various other elements may not be required for a desired application or design specification (e.g., type of programmable device).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure). It should also be understood that the various embodiments of the present invention as disclosed herein are not limited to programmable logic devices, such as PLD 100, and may be applied to various other types of programmable devices, as would be understood by one skilled in the art.

Configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically may be included to receive configuration data and commands to support serial or parallel device configuration and information transfer.

In accordance with one or more embodiments of the present invention, systems and methods are disclosed for implementing a logic analyzer within a PLD, such as PLD 100. For example, a logic analyzer architecture is disclosed that implements two types of blocks, referred to herein as a trigger unit (TU) block and a trigger expression (TE) block. As an example, the TU block may operate on one or more TU input signals to produce an output signal and thus, may be programmed for example for a specific comparison operation to provide the TU output signal that indicates a logical TRUE or FALSE in response to the state of the TU input signals. The TE block, for example, allows a user to define logic expressions that operate on one or more of the output signals provided by the TU blocks.

Figure 2:
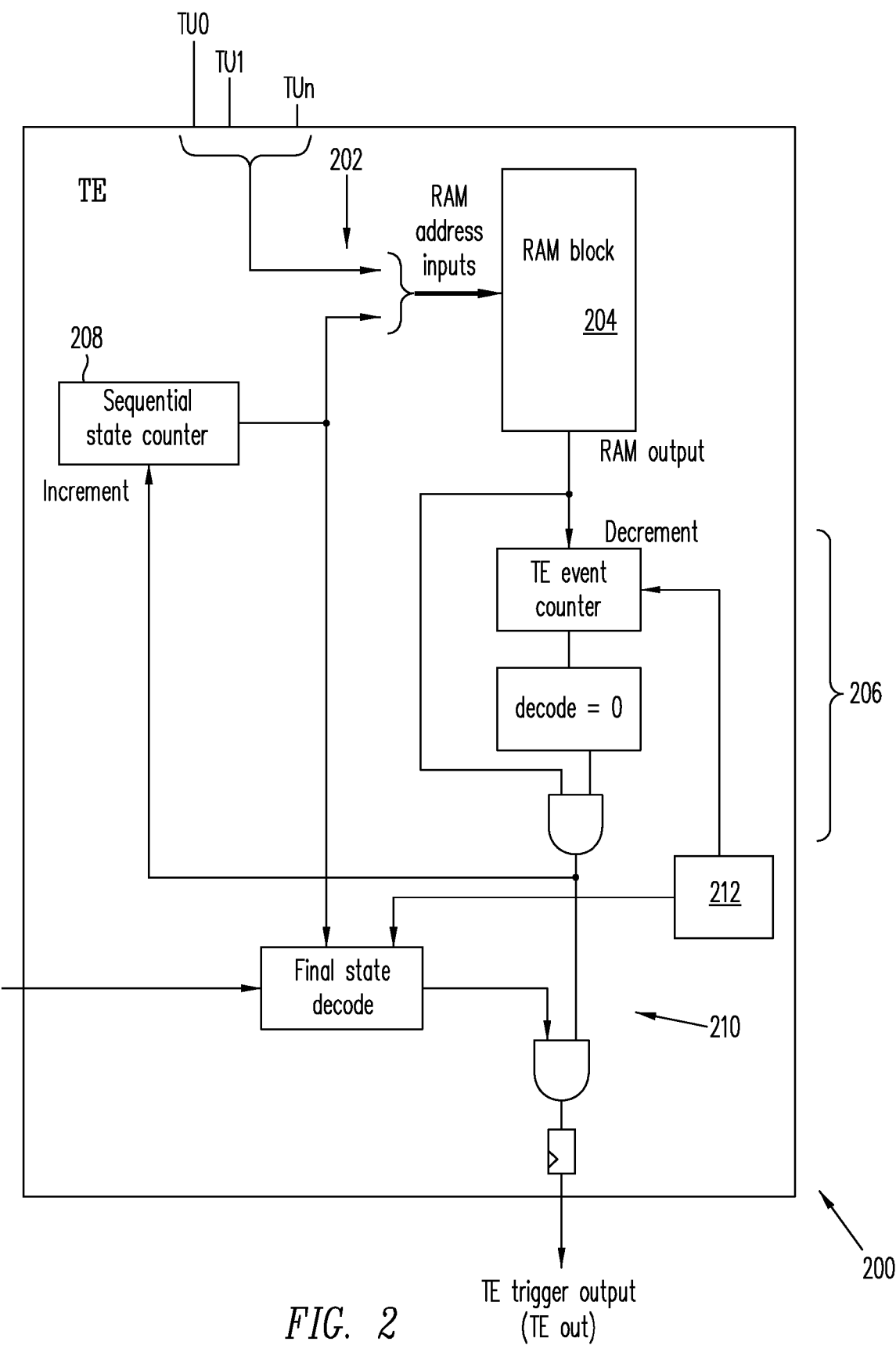
FIG. 2 shows a block diagram illustrating a portion of a logic analyzer architecture in accordance with an embodiment of the present invention.

For example, FIG. 2 shows a block diagram of TE logic 200, which illustrates an architecture implementation example of a TE block for a logic analyzer in accordance with an embodiment of the present invention. TE logic 200 may be programmed within a PLD to implement a logic expression (e.g., a trigger expression (TE)) defined by the user. Specifically, TE logic 200 receives one or more TU output signals (labeled TU0, TU1, . . . , through TUn from TU blocks (not shown), where "n" represents any desired number), with the TU output signals for example generated by monitoring signals from a circuit under test within the PLD.

The TU output signals (e.g., TU0 through TUn) are provided as address signals to address lines 202 of a memory 204 (e.g., a RAM block such as memory 106 of PLD 100 (FIG. 1)). Memory 204 implements the logic sub-expression truth tables of the TE, with the TU output signals representing the operands. As would be understood by one skilled in the art, memory 204 may be programmed at run-time via a software interface.

Memory 204 provides a memory output signal to counter logic 206, which may include a TE event counter that counts the number of times the output signal, from the selected sub-expression truth table, must be a logical TRUE before advancing to the next sub-expression truth table stored in memory 204. Counter logic 206 may be loaded, for example, from registers 212 that are programmed via software.

A counter output signal from counter logic 206 increments a counter 208 (e.g., a sequential state counter), whose output signal is provided to at least one address line 202 of memory 204 (e.g., to address the next sub-expression truth table) and to final state decode logic 210. As an example, when the output of a sub-expression truth table becomes logically TRUE, counter 208 advances and selects the next truth table output from the RAM block. Alternatively, if the trigger expression calls for a sub-expression to be logically TRUE more than once, then counter logic 206 counts to verify that the desired number of times a particular sub-expression goes logically TRUE is met before counter 208 advances. Counter logic 206 (e.g., the TE event counter) may be loaded from software registers (e.g., registers 212) and therefore may be defined for each sub-expression independently at run-time, which makes possible the count operator as discussed herein in reference to equation (2).

Final state decode logic 210 may be loaded, for example, from a register (e.g., one of registers 212) that is programmed with the total number of sequential states in the TE. The final trigger event occurs when all of the states defined in the trigger expression have evaluated as logically TRUE, and counter 208 has advanced through all enabled states. The number of states is derived from the user's trigger expression, and may be written at run-time to a software programmable register (e.g., registers 212) which sets the final state decode value.

As an example, TE logic 200 may allow a user to completely specify the trigger expression (TE) using conventional Boolean logic operators (e.g., AND, OR, XOR, NOT, etc.) and also provide a mechanism for implementing a sequential "THEN" operator to allow the TE to have defined states. For example, the overall TE may be represented in the general form of equation (1), where f is a logic expression involving Boolean operators. The operands (TE inputs) are the TU output signals (e.g., TU0, TU1, TU2, . . . ).

$$\text{trigger\_event} = f1(TU0, TU1, \ldots)$$
$$\text{THEN } f2(TU0, TU1, \ldots)$$
$$\text{THEN} \ldots \tag{1}$$

The overall TE has states that may be defined by the logic sub-expressions f1, f2, etc., which for example may be implemented as the logic sub-expression truth tables in memory 204 (e.g., hardware) by programming the sub-expressions into memory 204 within the logic analyzer IP core via a software interface. Consequently, this allows the TE to be modified by a user at run-time (e.g., software loads the contents of memory 204 at run-time). Memory 204 may be sized such that each truth table may implement any arbitrary Boolean equation with the TU output signals as operands.

As a general operational example for the general form of the TE (equation (1)), the f1 truth table is evaluated until logically TRUE and then the f2 truth table is evaluated until logically TRUE and so forth for all of the logic sub-expressions. Thus, the sequential "THEN" operator may be easily implemented.

By implementing counter logic 206, TE logic 200 allows a user to specify the number of times that the output of a truth table must be logically TRUE before advancing to the next state within the TE. As an example, counter logic 206 may be loaded with unique values for each sub-expression (i.e., each sub-expression truth table) in the overall TE equation and may be shared by all of the sub-expressions. As a specific example, a count operator (e.g., #5) may be defined for the TE equation, such as set forth in equation (2). For this specific example, the first sub-expression (f1) must be logically TRUE five times before advancing to the second sub-expression (f2), which must be logically TRUE before advancing to the third sub-expression (f3) that must be logically TRUE three times before the TE trigger output signal ($TE_{out}$) from TE logic 200 indicates (e.g., provides a logical TRUE signal) that the TE conditions are met.

trigger_event=f1(TU0 AND TU1 AND TU3)#5

THEN f2(TU2 OR TU4)

THEN f3(TU5 XOR TU6)#3 (2)

In general in accordance with one or more embodiments of the present invention, TE logic 200 may provide certain advantages over some conventional approaches of implementing a logic analyzer. For example, TE logic 200 may allow the user to specify each trigger sub-expression using any Boolean equation, with the equation inputs being the TU output signals. Additionally through the use of software programmable memory 204 and registers (e.g., registers 212), TE logic 200 may allow the trigger expression to be completely defined by the user at run-time.

Furthermore, TE logic 200 may employ memory 204 (e.g., a single RAM block, multiple RAM blocks, or distributed RAM) to implement truth tables which are accessed sequentially, with counter 208 driving the upper address bits of memory 204 to step from one truth table to the next to provide the "THEN" logic operator. Thus, the user may insert/delete "THEN" operators in the trigger expression at run-time. TE logic 200 may also employ counter logic 206 (e.g., an event counter) that may be shared across sub-expressions to count and verify the number of times a truth table output must be logically TRUE before proceeding to the next state (the next truth table). Counter logic 206 may be loaded from programmable registers (e.g., registers 212), which allows the desired count values to be specified by the user at run-time, and provides for the definition of the "#" count operator in the trigger expression.

Figures 6, 7:
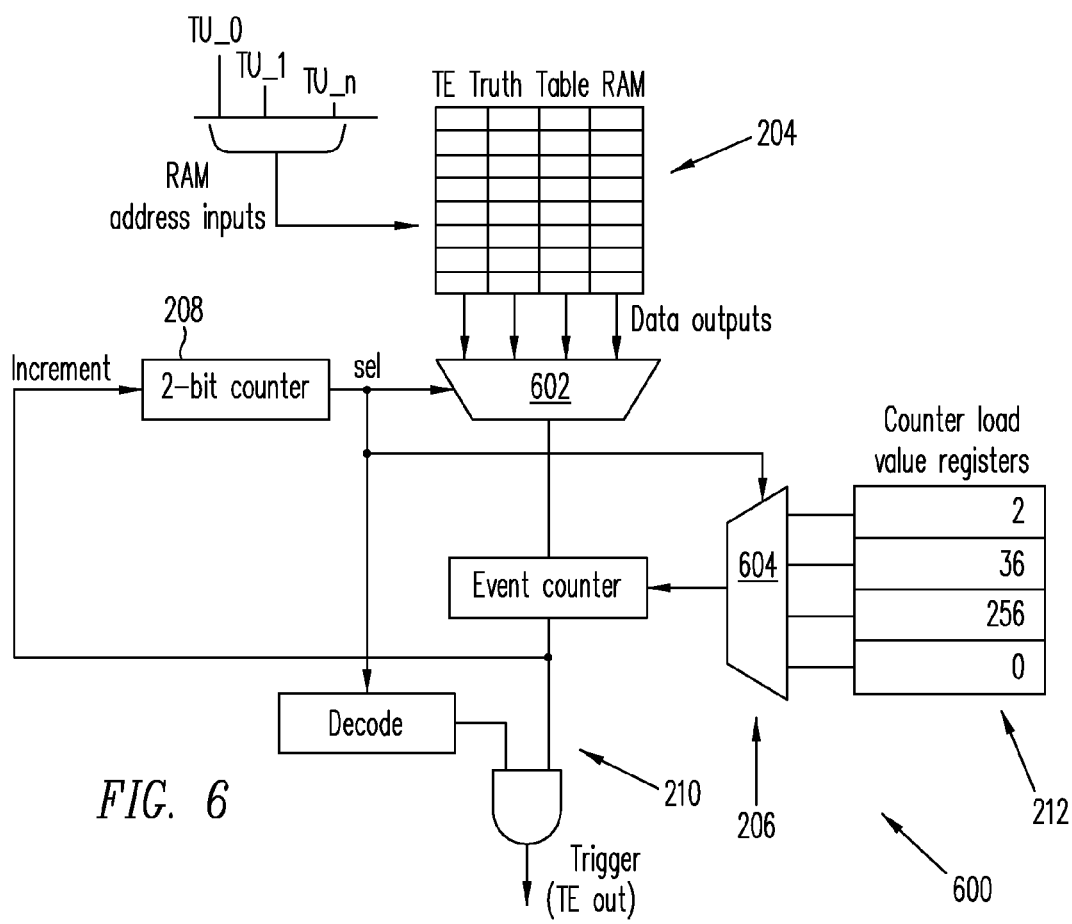
FIG. 6 shows a block diagram illustrating a logic analyzer architecture in accordance with an embodiment of the present invention.
FIG. 7 shows an example of code for implementing a logic analyzer expression within logic analyzer architectures disclosed herein in accordance with an embodiment of the present invention.

Referring briefly to FIG. 6, a block diagram of TE logic 600 is disclosed, which illustrates an alternative architecture implementation example of a TE block for a logic analyzer in accordance with an embodiment of the present invention. TE logic 600 is similar to TE logic 200 (FIG. 2) and therefore the description for common elements and functions will not be repeated. TE logic 600 differs from TE logic 200, for example, by using the output signal from counter 208 to control multiplexers 602 and 604 rather than to provide one or more addresses to memory 204 (e.g., with memory 204 having registered data outputs). Consequently, the output signal from counter 208 selects the desired truth table data output to provide to counter logic 206 and selects the desired register value from registers 212 to provide to counter logic 206 (for the event counter for that particular sub-expression truth table).

In general, a user of the logic analyzer must define when the logic analyzer triggers and begins capturing data. The trigger point may be defined by selecting a set of signals to be monitored, and then determining when those signals satisfy a set of user-defined conditions. The set of signals selected are provided to one or more TU blocks, as noted previously, which provide the TU output signals to the TE block (e.g., TE logic 200 of FIG. 2).

Figure 3:
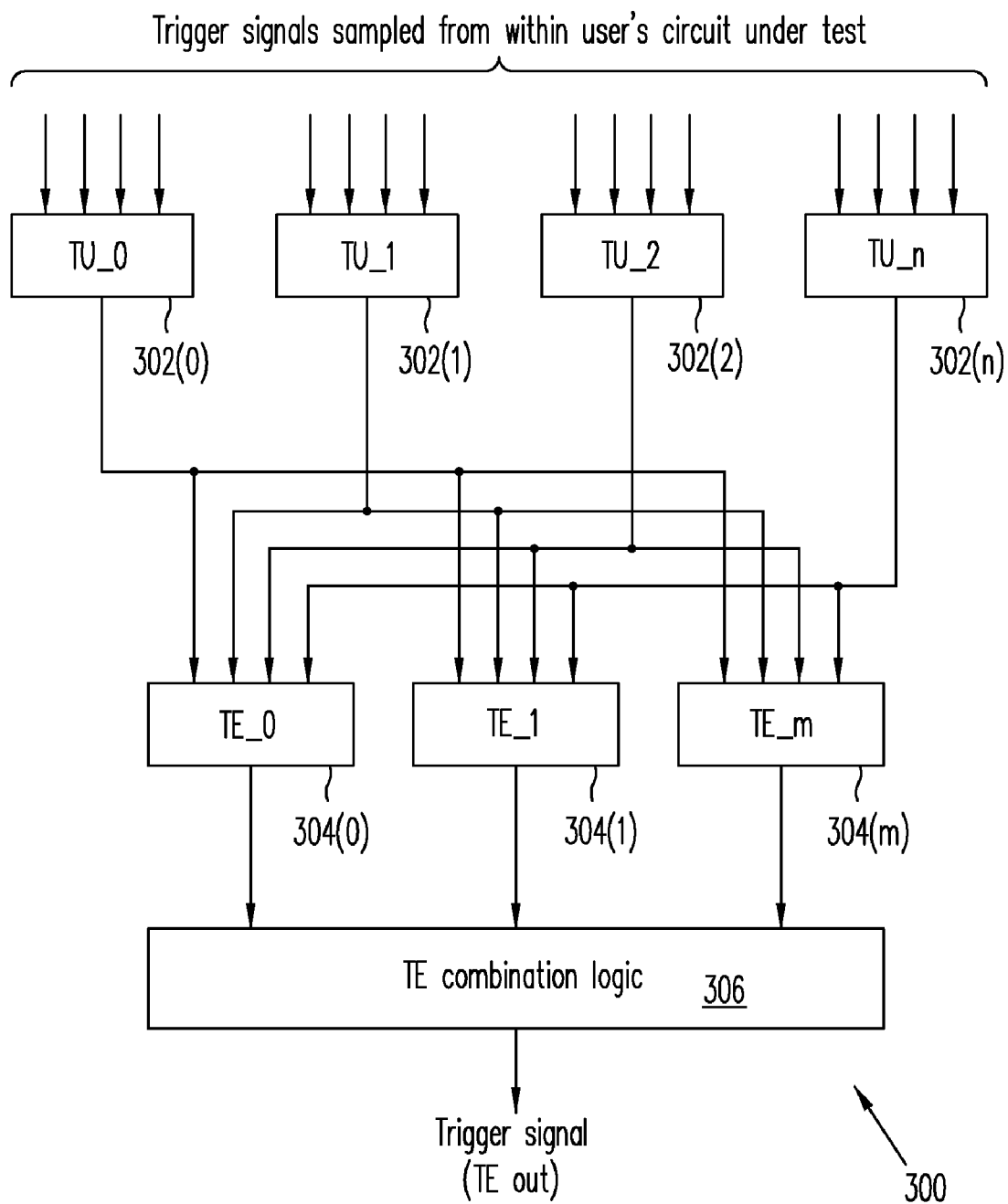
FIG. 3 shows a block diagram illustrating a portion of a logic analyzer architecture in accordance with an embodiment of the present invention.

For example, FIG. 3 shows a block diagram illustrating an architecture example for a logic analyzer 300 in accordance with an embodiment of the present invention. Logic analyzer 300 (e.g., a trigger circuit for a logic analyzer) includes one or more trigger units (TUs) 302 (separately referenced as 302(0) through 302(n), where "n" is any desired number), one or more trigger expressions (TEs) 304 (separately referenced as 304(0) through 304(m), where "m" is any desired number), and TE combination logic 306. TEs 304 and TE combination logic 306 may be implemented as discussed for TE logic 200 (FIG. 2), with TEs 304 representing for example the sub-expressions implemented in memory 204 and TE combination logic 306 representing for example generally the associated logic, memory (e.g., memory 204 and registers 212), and counters within TE logic 200 for providing the TE trigger output signal ($TE_{out}$). As would be understood by one skilled in the art, the TE trigger output signal ($TE_{out}$) would typically be captured by a trace memory of the logic analyzer (e.g., logic analyzer 300) to capture the state information from the circuit under test within the PLD.

Each TU 302 (e.g., TU 302(0)) may receive a number of trigger signals (e.g., 1 to 256) sampled from within a user's circuit under test implemented within the PLD. For example in accordance with one or more embodiments of the present invention, each TU 302 may be composed of one or more sub-blocks (e.g., the number of sub-blocks selected via software), with each sub-block operating on two input signals (e.g., A and B inputs). As noted previously, TEs 304 and TE combination logic 306 may be implemented in memory and logic (e.g., logic blocks) within the PLD and, similarly, TUs 302 may be implemented within the logic (e.g., logic blocks) of the PLD.

Figure 4:
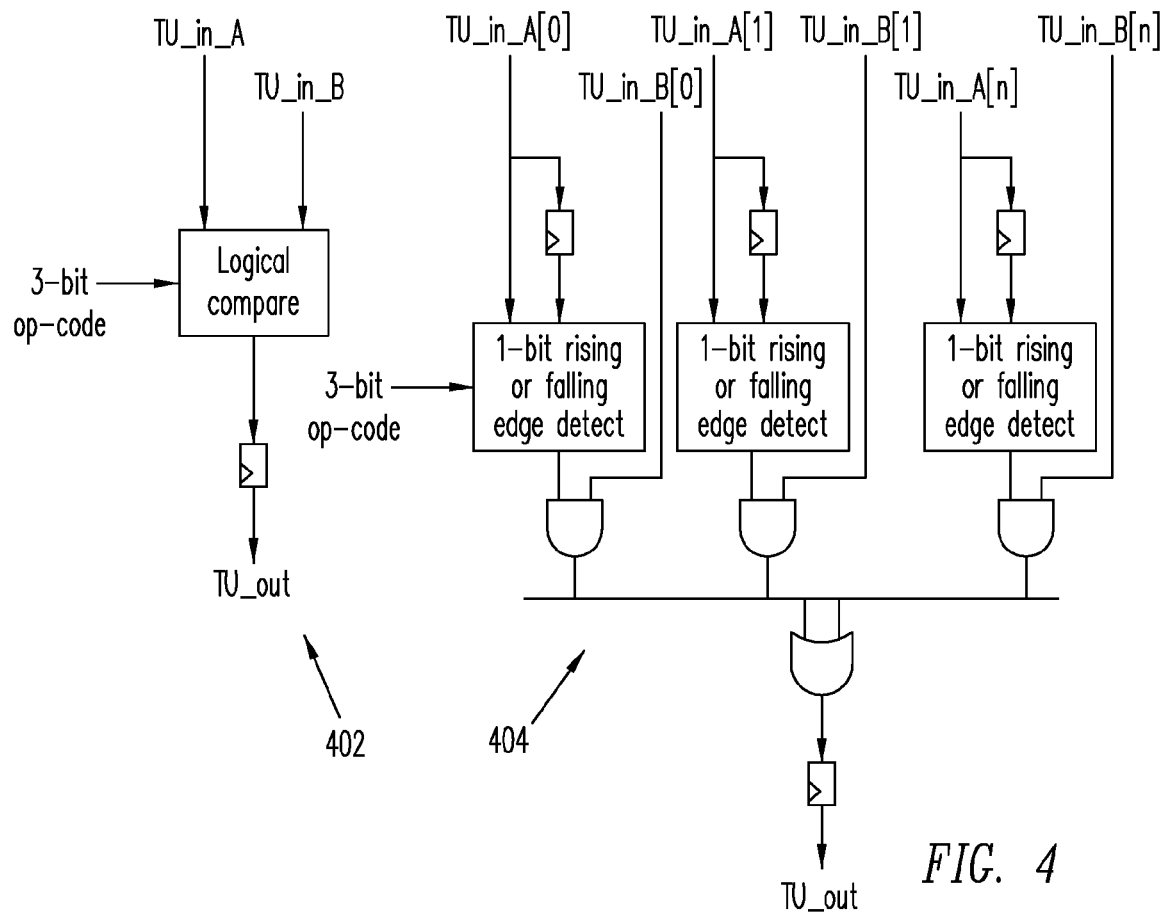
FIG. 4 shows a block diagram illustrating an exemplary implementation for a portion of the logic analyzer architecture of FIG. 3 in accordance with an embodiment of the present invention.

For example, FIG. 4 shows block diagrams illustrating exemplary circuit implementations for TUs 302 (FIG. 3) in accordance with one or more embodiments of the present invention. As an example, circuits 402 and 404 may represent implementation examples of a 1-bit TU 302 and an n-bit TU 302, respectively.

The A inputs (e.g., labeled TU_in_A) and the B inputs (e.g., labeled TU_in_B) may be sourced, for example, from trigger signals the user has selected for the circuit under test. Alternatively, one or more of the B inputs may be sourced, for example, from registers programmed with desired values (e.g., compare values) via software and may be limited only to the number of available registers.

Each TU 302 may perform various functions, such as for example one of eight possible functions on its two input operands as shown in Table 1. As an example, a 3-bit control signal (labeled Op-Code) may be provided to various sub-blocks of TU 302 (e.g., as illustrated in circuit 402 and in reference to Table 1) to program the desired function for the sub-block. For example, there are six logical compare functions that may be performed in addition to detecting either rising or falling edges on the inputs to the sub-block. As an example, if an edge-detect function is selected, then the B inputs (e.g., the "compare value") may be used as a mask.

TABLE 1

| Op-Code | Function |
|---|---|
| 0x0 | A equal to B |
| 0x1 | A not equal to B |
| 0x2 | A greater than B |
| 0x3 | A greater than or equal to B |
| 0x4 | A less than B |
| 0x5 | A less than or equal to B |
| 0x6 | Rising edge on A inputs (masked by B inputs) |
| 0x7 | Falling edge on A inputs (masked by B inputs) |

In general in accordance with one or more embodiments of the present invention, logic analyzer architectures are disclosed that use TU blocks, which implement comparisons or other types of logic or fixed operators for monitored signals and/or other signals (e.g., user-defined values), followed by TE blocks that may implement Boolean expressions, counters, sequential operations, and other types of complex logic or operations using the outputs of the TU blocks as operands. The logic analyzer architectures further allows special purpose TU blocks to be defined, such as for example a serial TU block as discussed further herein.

For example, some conventional approaches to serial bit detection use a state approach, where a trigger event occurs after a state-machine has traversed through a sequence of pre-defined states. Thus, to detect a serial bit pattern, a sequence of states must be defined with the matching of each sequential bit representing an individual state, with the overall pattern detected by advancing through the entire sequence of states. The disadvantage to this conventional approach is that it is overly complicated and cumbersome for detecting a simple serial pattern on a single signal.

In contrast in accordance with an embodiment of the present invention, a serial TU block implementation is disclosed that allows a single signal to be monitored for a pre-defined serial pattern. The detection of the serial pattern may then be used as one of the events that trigger the logic analyzer and may offer certain advantages over some conventional approaches that require logic to transition through state tables to detect a serial pattern. Specifically in one embodiment, a serial trigger unit implementation is disclosed for the TU block of a logic analyzer, which allows a user to select a signal to be monitored for a serial pattern (e.g., a serial bit pattern of any length) that they specify. If this pattern is detected on the monitored signal, then the serial trigger unit recognizes that a trigger event has occurred.

Figure 5:
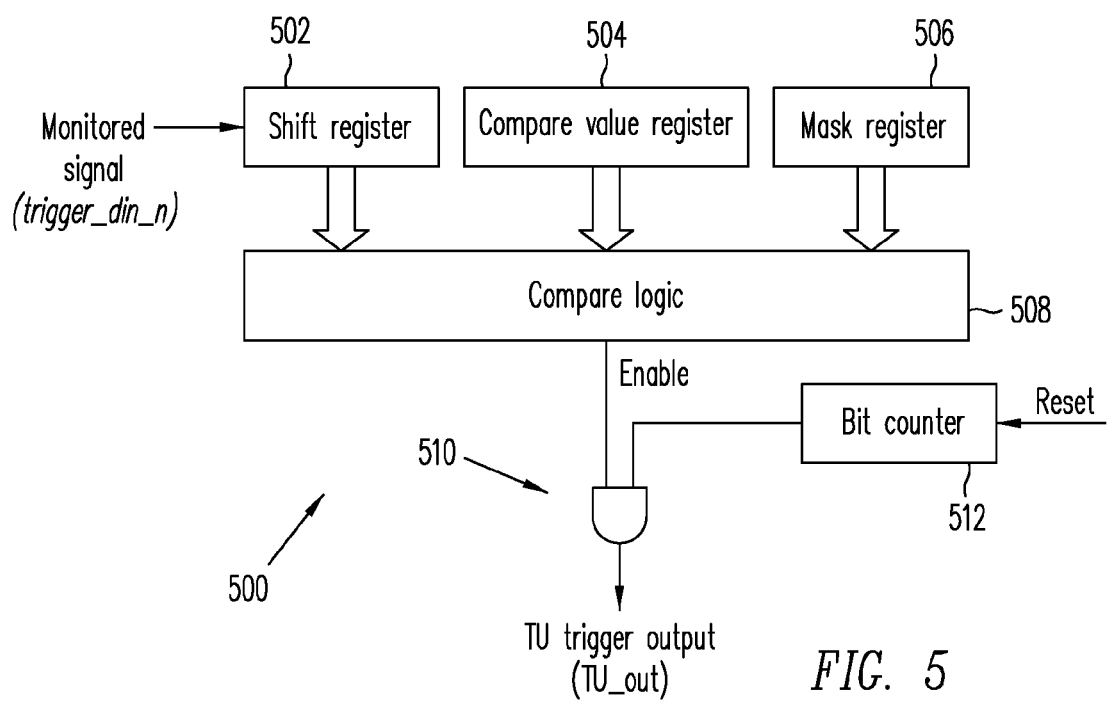
FIG. 5 shows a block diagram illustrating an exemplary serial implementation for a portion of the logic analyzer architecture of FIG. 3 in accordance with an embodiment of the present invention.

For example, FIG. 5 shows a block diagram of a circuit 500 illustrating an exemplary serial implementation for TU 302 (FIG. 3) of the logic analyzer architecture in accordance with an embodiment of the present invention. Circuit 500 includes a shift register 502, a compare value register 504, an optional mask register 506, compare logic 508, and counter logic 510.

Circuit 500 (the serial TU block) shifts the value of a monitored signal (labeled trigger_din_n) into shift register 502, for example, on each active edge of the user-defined sample clock. Once shift register 502 has filled with valid data, as determined by counter logic 510 (e.g., using a bit counter 512), the TU trigger output signal (TU_out) is enabled. Compare logic 508 checks for a match between shift register 502 and compare value register 504 every clock cycle until a match is detected (e.g., with a logical high signal provided as the TU trigger output signal when the match is detected) or circuit 500 is reset. Compare value register 504 and mask register 506 (if implemented) may be read/writeable by software to set their desired values.

Circuit 500 may be used when a user defines a TU block with only one input signal to be monitored, but with a compare value containing multiple bits, which may indicate to software that the user wants to monitor the TU input signal (the monitored signal) for a specific serial bit pattern (e.g., a serial bit stream pattern). Consequently, circuit 500 may allow a user to select a single signal to be monitored from the circuit under test, define a serial bit pattern as a compare value (e.g., any number of bits in length), and optionally define a mask value for optional mask register 506 which allows "don't care" bits in the compare value pattern.

As noted previously, systems and methods disclosed herein may allow for a flexible, user-friendly interface and may fully utilize the trigger expression logic implemented as lookup tables stored in memory (e.g., RAM). For example, because these lookup tables completely define any Boolean expression across their inputs, the user is free to create very interesting and complex trigger expressions. Conventional trigger expression entry methods are often cumbersome and very limiting, especially when the desired trigger expressions become large as the methods typically provide no method for grouping terms within the trigger expression (e.g., as is usually done with parenthesis or brackets).

In contrast in accordance with one or more embodiments of the present invention, trigger expression entry methods are disclosed that may be perceived as intuitive to users with programming or logic design experience. For example, techniques are disclosed for a user to input the TEs via a software interface and the manner in which the TE is evaluated by the software to populate the TE truth tables.

As a specific example in accordance with an embodiment of the present invention, a user may type the desired TE into a graphical user interface (GUI) box using C programming language operators or other types of operators (e.g., custom or newly defined operators). The TE may be entered as a text string containing the operators and operands, such as for example as with the TE shown in equation (3).

$$(((TU1\&TU2)\textasciicircum TU3)|TU4) \tag{3}$$

The TE of equation (3) may be captured by the GUI interface as a text string, and may then be executed in a programming language to create the values needed to populate the TE truth table (e.g., in memory 204). As a specific example, the GUI language may be TCL/TK (i.e., Tool command language and TK GUI toolkit) and, to execute the above TE directly into TCL, the TU operands are first changed to TCL variables by adding a preceding "$" (e.g., TU1 becomes $TU1). The string based on equation (3) may then be added as a line of code to a TCL routine, with the TE nested within "for-loops" that walk through all possible combinations of the TU operands, which allows the truth table values to be generated directly from the user's expression. As an example, FIG. 7 provides an example of the TCL code corresponding to equation (3) in accordance with an embodiment of the present invention.

The techniques disclosed herein allow the user the ability to enter very long and complex TEs into the GUI, with virtually no limit to the number of terms that the user's TE may include. Furthermore, the software may generate the truth table values with no parsing of the user's TE, thus minimizing the risk that a software error will cause incorrect truth table values. In addition, this method of entry allows the user to use parenthesis in their trigger expression, which allows the user to be able to create complex trigger expressions that are easily understandable.

Figure 8:
FIG. 8 shows an example of a graphical user interface for implementing a logic analyzer expression within logic analyzer architectures disclosed herein in accordance with an embodiment of the present invention.

For example, FIG. 8 shows an example of a graphical user interface (GUI) 800 for implementing a logic analyzer TE for logic analyzer architectures disclosed herein in accordance with an embodiment of the present invention. GUI 800 illustrates an interface for entering TU block information (section 802) and TE block information (section 804). The TU block information, for example, may include TU information such as the TU names, signal lists (e.g., list of chosen signals displayed when signal list is selected), operators (e.g., selectable from pull-down menu), radix (e.g., selectable from pull-down menu), and/or corresponding values (e.g., text field for a user to specify the comparison value).

The TE block information, for example, may include TE information such as the TE name, the TE expression (e.g., editable by the user in the TE expression text box), and/or sequence and maximum sequence (e.g., provided for user reference for proper resource management and feasible configuration). Radio buttons labeled AND ALL and OR ALL are provided for optionally commanding a logical AND or a logical OR, respectively, of the TES. A user may also enter event counter information, a maximum number of trigger events (samples per trigger), and a trigger position which may include trigger selection (e.g., pre-trigger, center-rigger, and post trigger selectable from pull-down menu) and user-defined trigger positions (e.g., by text entry box, selectable button, or user entry via sliding bar to select or directly type the sample number).

As would be understood by one skilled in the art, the information entered into GUI 800 may be used to generate configuration data for programming and configuring the PLD (e.g., PLD 100) to implement the desired user functions, including the logic analyzer implementation. For example, GUI 800 may form part of a software design tool (e.g., a computer program for execution by a computer), stored on a computer-readable medium, for generating configuration data and programming the PLD. As an example, the software design tool, in response to user action or input, may use the information received (e.g., TU and TE information along with other user design information) to generate configuration data and optionally to program the PLD for its intended use. A waveform viewer GUI may also be provided, as would be understood by one skilled in the art, to monitor signal waveforms and other signal information.

Systems and methods are disclosed herein to provide logic analyzer architecture implementations for programmable logic devices in accordance with one or more embodiments of the present invention. As an example of an embodiment of the present invention, a logic analyzer architecture includes trigger Units (TUs) and Trigger Expressions (TEs). The TUs may implement fixed operators (e.g., greater than, less than, equal to, rising edge, etc.), with the TU operands (inputs) being any nets from the circuit under test that the user wants to monitor. The TEs allow more complex trigger expressions to be built by the user using the outputs of the TUs as operands, with the TE operators being Boolean operators or other types of logic.

The TU may also be customized, such as to provide a serial TU for monitoring a serial bit stream in accordance with an embodiment.

Furthermore for example, in accordance with an embodiment of the present invention, systems and methods for entering and implementing a logic analyzer trigger expression within PLD logic (e.g., a PLD logic analyzer IP core) is disclosed to detect trigger events and provide a user with the desired results. In contrast to conventional approaches, the logic analyzer architecture may be simpler to implement and program, may be pipelined to operate at high clock frequencies, may allow a user to specify complex trigger expressions in a straightforward and understandable fashion, and/or may allow trigger expressions to be modified at run-time without having to completely reprogram the device functionality of the PLD.

As an example of an embodiment, a user may enter trigger expressions into a GUI interface as text strings using familiar operators, such as from the C-programming language. In contrast to drag-and-drop methods or pull-down boxes, both of which hinder the creation and entering of complex trigger expressions, systems and methods disclosed herein provide a very powerful yet natural method of user entry of trigger expressions, which may be directly evaluated as a software expression without requiring any parsing and with the final values needed to populate the trigger expression truth tables derived directly from the user's entry with minimal software intervention. Consequently, embodiments disclosed herein may simplify our software development effort, while also minimizing the risk that a software error will corrupt the user's expression.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A programmable logic device comprising:
a plurality of logic blocks;
an interconnect structure adapted to route signals among the logic blocks;
memory for storing data within the programmable logic device;
wherein one or more of the logic blocks are configured as trigger units, the trigger units each adapted to receive one or more input signals from within the programmable logic device and to provide a corresponding trigger unit output signal; and
wherein the memory stores a trigger expression, with the trigger unit output signals provided to the memory as address signals for the trigger expression.

2. The programmable logic device of claim 1, wherein the trigger expression comprises a series of logic sub-expressions having THEN count operators, with the trigger unit output signals functioning as operands of the trigger expression.

3. The programmable logic device of claim 1, wherein the memory comprises:
a plurality of configuration memory cells adapted to store configuration data to configure the programmable logic device; and
a memory block adapted to store the trigger expression.

4. The programmable logic device of claim 1, further comprising:
a configuration port for providing configuration data to the programmable logic device, wherein the configuration data includes the trigger expression; and a plurality of input/output blocks adapted to provide an input/output interface for the programmable logic device.

5. The programmable logic device of claim 1, wherein the trigger expression comprises a series of logic sub-expressions having THEN count operators, with the trigger unit output signals functioning as operands of the trigger expression, and wherein the programmable logic device further comprises:
a plurality of registers adapted to store values of the THEN count operators; and
a first counter adapted to receive data output signals from the memory storing the trigger expression and to determine if each of the THEN count operators are met based on the values stored in the registers to provide a first counter output signal.

6. The programmable logic device of claim 5, further comprising:
a second counter adapted to receive the first counter output signal and select the next logic sub-expression based on a value of the first counter output signal; and
a final state decode logic, coupled to the second counter, adapted to provide a trigger expression output signal after the series of logic sub-expressions have been selected by the second counter.

7. The programmable logic device of claim 1, wherein a trigger unit comprises one or more sub-block trigger units adapted to receive two of the input signals and to provide a trigger unit sub-block output signal, with the corresponding trigger unit output signal based on the trigger unit sub-block output signals.

8. The programmable logic device of claim 1, wherein at least one of the trigger units is a serial trigger unit comprising:
a shift register adapted to receive the input signal having a serial bit pattern;
a compare value register adapted to store a test bit pattern; and
compare logic adapted to compare the serial bit pattern of the input signal stored in the shift register to the test bit pattern stored in the compare value register and to provide the trigger unit output signal to indicate if the serial bit pattern matches the test bit pattern.

9. The programmable logic device of claim 8, wherein the serial trigger unit further comprises:
a bit counter adapted to verify a bit count of the serial bit pattern and enable the compare logic to provide the trigger unit output signal; and
a mask register, wherein the compare logic uses data stored in the mask register to identify don't care bits.

10. A programmable logic device comprising:
a plurality of logic blocks;
means for routing signals among the logic blocks;
means for storing data within the programmable logic device;
means for monitoring one or more signals of the logic blocks to provide trigger unit output signals; and
wherein the storing means is adapted to store a trigger expression, with the trigger unit output signals provided to the storing means as address signals for the trigger expression.

11. The programmable logic device of claim 10, further comprising:
a plurality of configuration memory cells adapted to store configuration data to configure the programmable logic device;
means for providing configuration data to the configuration memory cells, wherein the configuration data includes the trigger expression;

a plurality of input/output blocks adapted to provide an input/output interface for the programmable logic device; and
wherein the trigger expression comprises a series of logic sub-expressions having count operators, with the trigger unit output signals functioning as operands of the trigger expression.

12. The programmable logic device of claim 10, wherein the trigger expression comprises a series of logic sub-expressions having count operators, with the trigger unit output signals functioning as operands of the trigger expression, and wherein the programmable logic device further comprises:
means for storing values of the count operators;
means for receiving data output signals from the trigger expression within the storing means and determining sequentially if each of the count operators are met, based on the count operator values stored, to provide a first counter output signal; and
means for receiving the first counter output signal and selecting the next logic sub-expression based on a value of the first counter output signal; and
means for providing a trigger expression output signal after the series of logic sub-expressions have been selected.

13. The programmable logic device of claim 10, wherein the trigger expression comprises Boolean equations and logic operators, with the trigger unit output signals functioning as operands of the trigger expression.

14. The programmable logic device of claim 10, wherein at least one of the signals represents a serial bit stream, and wherein the monitoring means further comprises means for comparing the serial bit stream to a test bit pattern having don't care bits.

15. A computer-readable medium on which is stored a computer program for performing a method comprising:
programming a programmable logic device to provide trigger units of a logic analyzer, the trigger units each monitoring one or more input signals within the programmable logic device to provide a corresponding trigger unit output signal; and
programming a memory of the programmable logic device to store a trigger expression of the logic analyzer, with the trigger unit output signals provided to the memory as address signals for the trigger expression.

16. The method of claim 15, wherein the trigger expression comprises a series of logic sub-expressions having count operators, with the trigger unit output signals functioning as operands of the trigger expression and with the trigger expression providing a trigger expression output signal based on the trigger unit output signals.

17. The method of claim 15, wherein the trigger expression comprises a series of logic sub-expressions having count operators, with the trigger unit output signals functioning as operands of the trigger expression, and wherein the method further comprises:
programming the programmable logic device to store count operator values;
programming the programmable logic device to sequence through the logic sub-expressions based on the count operator values; and
programming the programmable logic device to provide a trigger expression output signal after sequencing through the logic sub-expressions.

18. The method of claim 15, wherein each of the trigger units comprise at least one sub-block trigger unit adapted to receive two of the input signals and provide a trigger unit sub-block output signal, with the corresponding trigger unit output signal based on the trigger unit sub-block output signals.

19. The method of claim 15, wherein at least one of the trigger units is configured as a serial trigger unit, with the method further comprising:

programming the programmable logic device to store a test bit pattern;

programming the programmable logic device to compare the test bit pattern to the input signal received by the serial trigger unit and indicate if a serial bit pattern of the input signal matches the test bit pattern.

20. The method of claim 19, further comprising programming the programmable logic device to ignore don't care bits of the serial bit pattern of the input signal.

* * * * *